United States Patent
Duan et al.

(10) Patent No.: US 6,734,964 B1
(45) Date of Patent: May 11, 2004

(54) PULSED, ATMOSPHERIC PRESSURE PLASMA SOURCE FOR EMISSION SPECTROMETRY

(75) Inventors: Yixiang Duan, Los Alamos, NM (US); Zhe Jin, Cockeysville, MD (US); Yongxuan Su, San Diego, CA (US)

(73) Assignee: The Regents of the University of California, Los Alamos, NM (US)

( * ) Notice: Subject to any disclaimer, the term of this patent is extended or adjusted under 35 U.S.C. 154(b) by 203 days.

(21) Appl. No.: 09/998,273

(22) Filed: Nov. 30, 2001

Related U.S. Application Data
(60) Provisional application No. 60/250,765, filed on Nov. 30, 2000.

(51) Int. Cl.$^7$ .............. G01J 3/30; G01J 3/42; B01D 59/44
(52) U.S. Cl. .......... 356/316; 356/311; 356/313; 356/319; 250/282; 250/286; 250/288
(58) Field of Search ............... 356/311, 313, 356/316, 319; 250/282, 286, 288

(56) References Cited

U.S. PATENT DOCUMENTS

| | | | |
|---|---|---|---|
| 6,056,738 A | * | 5/2000 | Marchitto et al. |
| 6,124,592 A | * | 9/2000 | Spangler |
| 6,387,059 B1 | * | 5/2002 | Marchitto et al. |
| 6,504,149 B2 | * | 1/2003 | Guevremone et al. |

OTHER PUBLICATIONS

Pulsed Discharge Helium Ionization Detector (Wentworh et al Chromatographia Vol 34,No. 5–8, Sep./Oct. 1992).*
M.P Sinha and G. Gutnikov, *Anal. Chem.* (1991) 63, 2012–2016.
A.J. McCormack et al., *Anal. Chem.* 1965, 37, 1470–1476.
Ryszard Lobinski and Freddy C. Adams, Spectrochimica Acta Part B 52 (1997) 1865–1903.
L.J. Jerrell et al., Applied Spectroscopy 53 (1999), 245–248.
Jan C.T. Eijkel et al., Anal. Chem. 1999, 71, 2600–260.
Jan C.T. Eijkel et al., Anal. Chem. 2000, 72, 2547–2552.
U. Engel et al., *Anal. Chem.* (2000) 72, 193–197.
R.S. Braman and A. Dynako, Anal. Chem. (1968) 40, 95–106.
R.H. Decker, Spectrochim. Acta (1980) 35B, 19–31).
R.B. Constanzo and E.F. Barry, Anal. Chem. (1988) 60, 826–829).

(List continued on next page.)

*Primary Examiner*—Frank G. Font
*Assistant Examiner*—Khaled Brown
(74) *Attorney, Agent, or Firm*—Mark N. Fitzgerald; Samuel M. Freund

(57) ABSTRACT

A low-power, plasma source-based, portable molecular light emission generator/detector employing an atmospheric pressure pulsed-plasma for molecular fragmentation and excitation is described. The average power required for the operation of the plasma is between 0.02 W and 5 W. The features of the optical emission spectra obtained with the pulsed plasma source are significantly different from those obtained with direct current (dc) discharge higher power; for example, strong CH emission at 431.2 nm which is only weakly observed with dc plasma sources was observed, and the intense CN emission observed at 383–388 nm using dc plasma sources was weak in most cases. Strong CN emission was only observed using the present apparatus when compounds containing nitrogen, such as aniline were employed as samples. The present apparatus detects dimethylsulfoxide at 200 ppb using helium as the plasma gas by observing the emission band of the CH radical. When coupled with a gas chromatograph for separating components present in a sample to be analyzed, the present invention provides an apparatus for detecting the arrival of a particular component in the sample at the end of the chromatographic column and the identity thereof.

50 Claims, 7 Drawing Sheets

OTHER PUBLICATIONS

W.E. Wentworth et al., Chromatographia (1992) 34, 219–225).
S.A. Estes et al., Anal. Chem. (1981) 53, 1829–1837.
B.M. Patel et al., Anal. Chem. 1987, 59, 2374–2377.
G.W. Rice et al., Spectrochim. Acta (1985) 40B, 1573–1584.
B.D. Quimby and J.J. Sulliva, Anal. Chem. (1990) 62, 1027–1034.
H. Ogino and T. Seki, Anal. Chem. (1997) 69, 3636–3640.
I. Ishii and A. Montaser, Spectrochim. Acta (1991) 46B, 1197–1206.
D.G. Sutton et al., Anal. Chem. (1979) 51, 1399–1401.
W.R. McLean et al., Analyst. (1973) 98, 432–442.
L. Ebdon et al., Analyst. (1986) 111, 1113–1138.

* cited by examiner

PULSED, ATMOSPHERIC PRESSURE PLASMA SOURCE FOR EMISSION SPECTROMETRY

RELATED APPLICATIONS

This application claims the benefit of provisional application 60/250,765, filed Nov. 30, 2000.

STATEMENT REGARDING FEDERAL RIGHTS

This invention was made with government support under Contract No. W-7405-ENG-36 awarded by the U.S. Department of Energy to The Regents of The University of California. The government has certain rights in the invention.

FIELD OF THE INVENTION

The present invention relates generally to plasma generation and, more particularly, to the use of a pulsed dc, atmospheric pressure plasma in cooperation with a spectrometer for generating, analyzing and detecting light emission from species present in the plasma.

BACKGROUND OF THE INVENTION

Field-portable monitoring technologies are required in the chemical industry, for national defense, and for environmental protection in order to obtain real-time data concerning chemical emissions in air, to identify the sources of chemicals, and to reduce or eliminate the emissions of toxic chemicals. Analytical equipment such as gas chromatography (GC), high-performance liquid chromatography (HPLC), mass spectrometry (MS), inductively coupled plasma atomic emission spectrometer (ICP-AES), ICPMS, and GC/MS have been used to analyze chemical emissions in the environment. However, most of the currently available equipment is large, expensive, and unsuited for real-time field use. Therefore, there is a strong need to develop miniature, field-portable analytical instruments.

By employing a separation technique such as capillary gas chromatography, it is possible to develop a compact separation instrument. A field-portable gas chromatography/ mass spectrometer instrument was reported by M. P Sinha and G. Gutnikov, *Anal. Chem.* (1991) 63, 2012–2016. A microbore column 3 m in length and having a 50 µm inner diameter was used for separation. Such columns allow the carrier gas flow rate to be reduced to 0.05 atm·cm$^3$·min$^{-1}$ and significantly reduces the weight and power needs of the mass spectrometer.

Plasma-based emission spectrometry was first used as a GC detector by A. J. McCormack et al., *Anal. Chem.* 1965, 37, 1470–1476. A microwave-induced plasma (MIP) provided the energy for molecular fragmentation and excitation. For a review of more recent developments, see for example "Speciation analysis by gas chromatography with plasma source spectrometric detection" by Ryszard Lobinski and Freddy C. Adams, Spectrochimica Acta Part B 52 (1997) 1865–1903. See also: "Low Power Inductively Coupled Plasma Source for Element-Selective Atomic Emission Detection in Gas Chromatography" by L. J. Jerrell et al., Applied Spectroscopy 53 (1999), 245–248.

In "A Molecular Emission Detector on a Chip Employing a Direct Current Microplasma, by Jan C. T. Eijkel et al., Anal. Chem. 1999, 71, 2600–260, and in "A dc Microplasma on a Chip Employed as an Optical Emission Detector for Gas Chromatography" by Jan C. T. Eijkel et al., Anal. Chem. 2000, 72, 2547–2552, a direct current (dc) atmospheric pressure microplasma detector on a glass chip having a plasma volume of 50 nL is described. Hexane was detected at a level of 800 ppb with a linear dynamic range. Emission from the species in the plasma was observed using optical fibers through the wall of the glass chip in a direction perpendicular to the direction of the plasma gas flow.

A low-power microwave plasma detector was recently developed by U. Engel et al., *Anal. Chem.* (2000) 72, 193–197. A plasma having a longitudinal extension of 2–3 cm was generated with a forward power of 10–40 W. Because the power consumption is low, it is possible to operate the detector with a semiconductor microwave source powered by a car battery. Because of the low operational power, the rotational temperature of the plasma was reported to be about 650 K, thus the plasma has very low tolerance for water-loaded aerosols. Additionally, gas pressure and sample vapor clouds had a strong effect on plasma characteristics and performance.

Direct current (See, e.g., R. S. Braman and A. Dynako, Anal. Chem. (1968) 40, 95–106 and R. H. Decker, Spectrochim. Acta (1980) 35B, 19–31), alternating current (See, e.g., R. B. Costanzo and E. F. Barry, Anal. Chem. (1988) 60, 826–829), and high-voltage pulsed (See, e.g., W. E. Wentworth et al., Chromatographia (1992) 34, 219–225) plasma detectors have been reported. These detectors are simple to build and consume less power than other plasma sources. In "Pulsed Discharge Helium Ionization Detector" by W. E. Wentworth et al., supra, the authors describe a pulsed discharge helium ionization detector for gas chromatography. A pulsed, dc discharge is caused to occur between opposing, spaced-apart platinum wire electrodes. The volume of the discharge is small and is used to generate ions which are detected. Although a quartz window was placed at the end of the detector such that emission spectra from the discharge could be observed with a monochromator simultaneously with the ionization detection, the authors state that the window was unessential and was used merely to visually observe the discharge for color and stability. Additionally, only the permanent gases, including methane, and some inorganic gases were analyzed. There is no mention of detecting the light emitted from the pulsed discharge for organic or other species detection.

Accordingly, it is an object of the present invention to provide an apparatus and method for generating a plasma and detecting species present in the plasma using light emission characteristic thereof.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention, as embodied and broadly described herein, the pulsed, atmospheric pressure plasma apparatus for generating and analyzing light emission characteristic of species in the plasma hereof includes: an electrically insulating hollow tube open at one end and having a wall; a grounded metallic electrode piercing the wall of the hollow tube; a second metallic electrode piercing the wall of the hollow tube in the vicinity of said grounded electrode; means for flowing a gas in which the species is entrapped through the hollow tube; a high voltage dc pulse generator in electrical contact with the second electrode for generating a pulsed plasma in the gas flowing between the grounded electrode and the second electrode; and an optical spectrometer for spectrally resolving and detecting the light emission exiting the open end of the hollow tube characteristic of the species entrapped in the gas.

In another aspect of the present invention in accordance with the objects and purposes thereof the atmospheric pressure plasma method for generating and analyzing light emission characteristic of species in the plasma hereof includes the steps of: flowing a gas containing the species through an insulating hollow tube open at one end; generating a pulsed plasma between a grounded electrode and a second electrode disposed in the electrically insulating hollow tube by applying a pulsed dc voltage to the second electrode, whereby the species are excited; and spectrally resolving and detecting light emission exiting the hollow tube from the open end thereof.

Benefits and advantages of the present low-power, pulsed plasma source for molecular emission spectrometry include: (1) low power consumption (between 0.0 2 W and 5 W); (2) good tolerance to organic vapors; (3) small size; (4) high sensitivity to organic vapors; and (5) field-portable, real-time detection capability.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings.

DETAILED DESCRIPTION

Briefly, the present invention includes an apparatus and method for generating a pulsed, atmospheric pressure plasma suitable for producing emission of light characteristic of species present in the plasma gas and for spectroscopically analyzing and detecting the emitted light. When coupled with a gas chromatograph for separating components present in a sample to be analyzed, the present invention provides an apparatus for detecting the arrival of a particular component in the sample at the end of the chromatographic column and the identity thereof. The emission generator/detector may be operated at average input powers between 0.02 W and 5 W. Because of the low power requirements, two 1.5 V alkaline batteries were found to maintain the detector with a 0.2 W power input to the plasma for more than 10 h. Organic vapors were detected by monitoring the CH emission at 341.2 nm. Emission bands for C and CN were observed to be weak for organic compounds that do not contain nitrogen.

Figure 1:
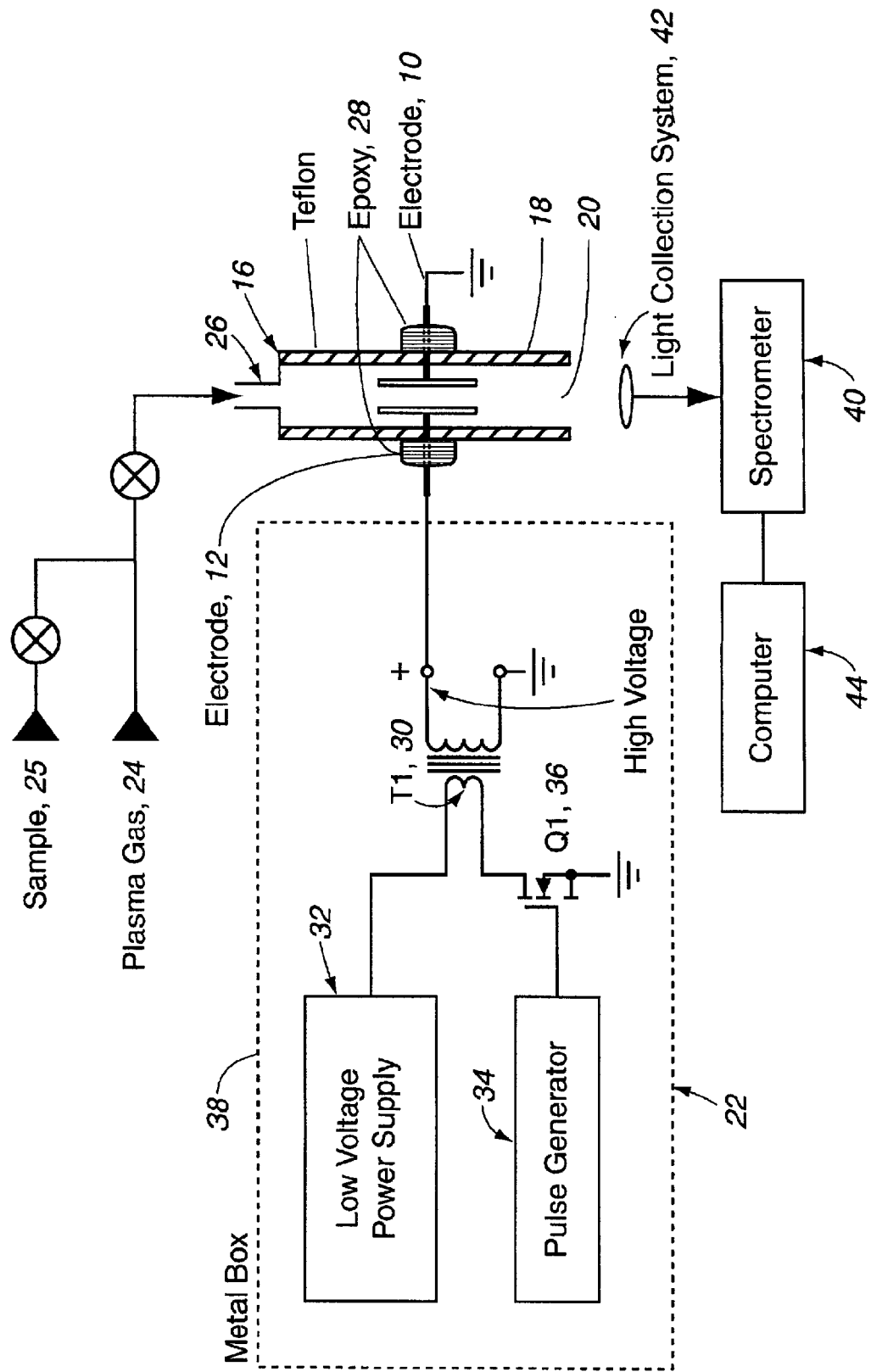
FIG. 1 is a schematic representation of the apparatus of the present invention.

Reference will now be made in detail to the present preferred embodiments of the invention which are illustrated in the accompanying drawings. Turning now to the drawings, FIG. 1 shows a schematic representation of the atmospheric pressure, pulsed plasma light emission source of the present invention. A grounded planar platinum electrode, 10, and a second planar platinum electrode, 12 (both 0.04 mm in thickness and 3 mm in width), were spaced apart and disposed such that the planar faces thereof were opposite one another (face-to-face) inside Teflon tube, 16 (40 mm long and 7 mm o.d.), having wall, 18, and open end, 20. The distance between the electrodes was approximately 1.5 mm. A high-voltage pulse was applied to electrode 12 from pulsed dc high voltage supply, 22, in order to generate a pulsed, atmospheric pressure plasma in plasma gas, 24, which is used to entrap the sample to be investigated, 25, when desired, and introduced into the closed end, 26, of tube 16. By pulsed dc voltage it is meant that the waveform of the voltage applied to the powered electrode appears as a square wave having chosen variable pulse duration and spacing. Either positive or negative high voltage can be applied to electrode 12, and clearly, other electrode configurations and materials can be employed as long as a substantially uniform plasma is generated. Epoxy, 28, was used to affix the electrodes in position and to seal wall 18 to prevent gas leakage therefrom at the location where the electrodes pierce the wall.

Power transformer T1, 30, (primary voltage 230 V; secondary voltage 6.3 V) was used to generate the high-voltage impressed onto electrode 12 in a similar manner to the way an ignition coil is used (See, e.g., W. E. Wentworth et al., supra). In order to generate high voltage, the secondary wires of the transformer were used as primary wires, and the primary wires were used as secondary wires. Low voltage from a 15 V dc power supply or batteries, 32, was applied to transformer 30 and a high-voltage output was obtained during charging and discharging cycles, which were controlled by pulse generator, 34, and power transistor (Q1), 36. The adjustable parameters that are important for discharging performance include charging time ($T_c$), discharging time ($T_d$), and voltage applied to the primary wires ($E_{pri}$). The operating frequency ranged from 350 Hz to 1000 Hz. A stable pulsed plasma source could be generated with this power supply. The electrical components were housed in a shielded 21 cm×15 cm×5.5 cm aluminum box, 38. The total weight of the pulsed power supply is around 3 pounds. Clearly, other sources of pulsed dc voltage may be used.

The plasma was generated using plasma gases such as helium, argon, nitrogen, or air when a high-voltage pulse was applied to the discharge electrodes. The emission spectrum from the plasma was monitored with an Ocean Optics PC2000 spectrometer system (Dunedin, Fla.), 40. Light collection system, 42, included a collimating lens, for converting divergent beams of light into a parallel beam and focusing the beam through an optical fiber (not shown in FIG. 1) and into the spectrometer system 40 which was optimized for the wavelength range between 200 nm and 480 nm. A Sony ILX511 linear CCD-array detector with 2048-element pixels was used for light detection. A 200 $\mu$m diameter fiber and a 2400 grooves/nm grating were used for the instrument. Clearly, other light collection and dispersion apparatus could be applied to the present invention. A Windows-based OOIChem operating software was used for data acquisition and signal processing with computer, 44, having a 100 kHz sampling frequency DAQ-700 card (National Instruments Inc., USA) which allowed viewing spectra in real time and data storage.

Discharge parameters were monitored using an HP 54520A Oscilloscope (Palo Alto, Calif.). The discharge voltage was measured with a 100:1 voltage divider, and the current was determined by measuring the voltage-drop across a 100$\Omega$ resistor having the ground return.

Organic vapor samples were introduced using two procedures, although virtually any method for flowing gas through the present emission generator/detector should find applicability. Since dimethylsulfoxide, DMSO, has a vapor pressure of 0.4 Torr at 20° C., helium gas saturated with DMSO vapor could be introduced directly into the plasma without affecting the plasma stability. However, when helium gas saturated with other highly volatile organic vapors such as methanol or acetone was continuously fed into the plasma, the plasma became unstable. Thus, these volatile compounds had to be introduced into the plasma using a different method. First, a piece of Tygon tubing was rinsed with a volatile organic solvent. The Tygon tubing with adsorbed the organic solvent was then connected to the plasma gas line and helium gas passed therethrough sweeping the adsorbed organic compounds adsorbed into the plasma. Using this method, volatile organic compounds were introduced and a stable plasma maintained. It should be mentioned that the pulsed plasma light emission generator/detector of the present invention is well suited for analyzing the effluent from a gas chromatograph which allows the separation of various gas components before they enter the present apparatus.

High purity argon, helium, and nitrogen (99.999%, Trigas Industrial Gases, USA) were used as plasma gases. Methanol, ethanol, acetone, dichloromethane, aniline, and DMSO (Aldrich, Milwaukee, USA) were used as received.

Having generally described the present invention, the following EXAMPLE provides greater detail as to the operation thereof. In what follows hereinbelow, the emission detector of the present invention was operated at room temperature and atmospheric pressure.

EXAMPLE

The no-load output voltage of the high-voltage pulsed power supply ranged from 2000 to 4000 V. The pulse parameters of 1100 $\mu$s charging time ($T_c$) and 100 $\mu$s discharging time ($T_d$) were commonly used. With an input voltage ($E_{pri}$) of 2.5 V, a pulse height around 2000 V was obtained. At a pulse height of 2000 V, bright plasma was instantly observed when argon or helium was used as the plasma gas at a flow rate of 0.5 l/min. However, no discharge was observed when nitrogen was used as the plasma gas under the same conditions. A stable nitrogen plasma could only be generated when the $E_{pri}$ was further increased to 7.92 V, corresponding to a pulse height of about 3000 V. Similar observations were made when air was used as the plasma gas.

The operational power increased linearly with $E_{pri}$ up to 5.53 V and remained constant with a further increase of $E_{pri}$. The average operational power ranged from 0.04 W at an $E_{pri}$ of 2.5 V to 0.16 W at an $E_{pri}$ of 7.91 V. However, input power between 0.02 W and 5 W may be employed. In order to reduce the power consumption of the detector, either argon or helium was required as the plasma gas. Because helium has a higher metastable state energy for excitation and ionization of organic compounds, it was selected as the plasma gas for demonstrating the present invention.

Two Duracell size D batteries (1.5V) were used to power the transformer circuitry. A stable helium plasma was maintained for more than 10 h with a He flow rate of 0.1 l/min, a pulse frequency of 670 Hz and $E_{pri}$ of 1.5V. Since a single size D battery has a capacity of 15000 MAH and the maximum average discharge current in the experiment is around 50 mA, the operational time was estimated to be around 600 h with two D alkaline batteries. However, because a voltage regulator and additional circuitry were used to adjust the output voltage, the practical operational time will be shorter.

Figure 2:
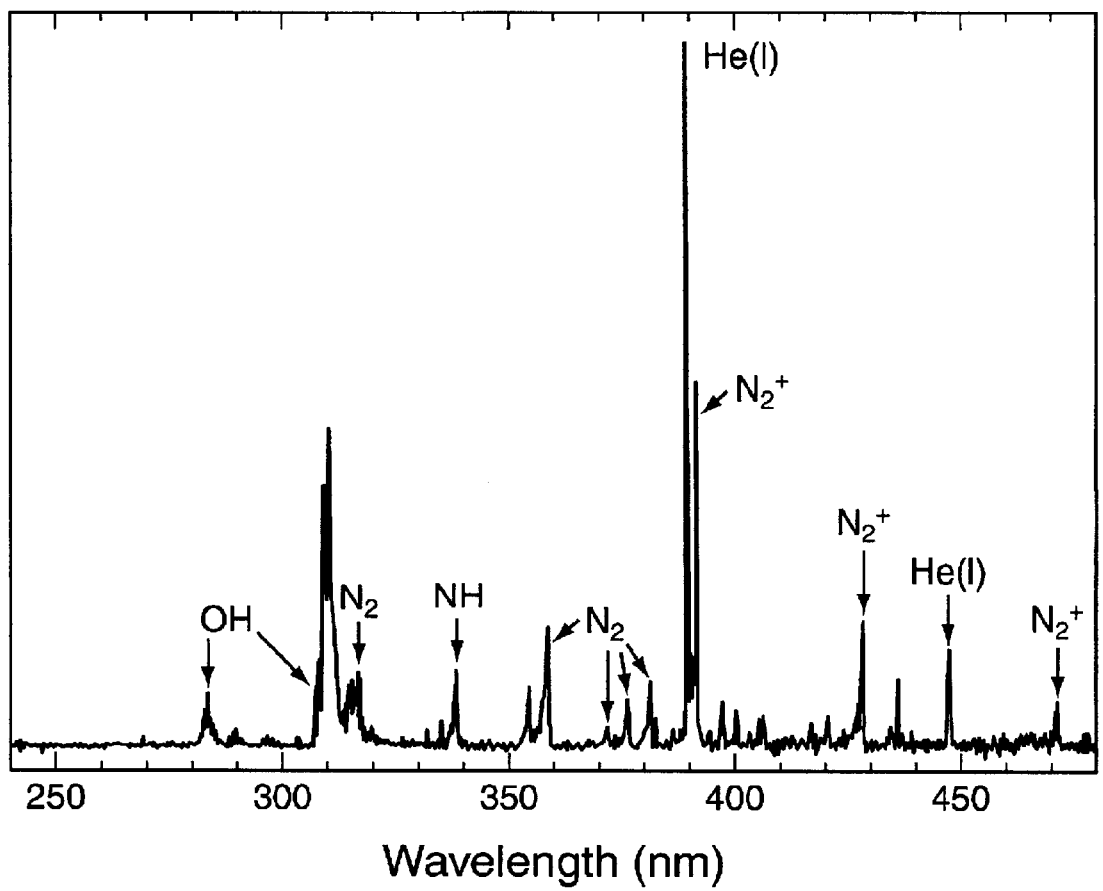
FIG. 2 shows a typical background emission spectrum of the pulsed plasma of the present invention where helium is used as the plasma gas and the He flow rate is 3.0 l/min; the discharge frequency is 830 Hz; $T_c$ is 1100 $\mu$s, $T_d$ is 100 $\mu$s and $E_{pri}$ is 4.55 V; the integration time is 200 ms; and the number of spectra averaged is 10.

FIG. 2 is an emission spectrum of an atmospheric pressure helium plasma for the wavelength region between 240 and 500 nm. Shown are typical helium emission lines and significant molecular bands of OH, NH, $N_2$, and $N_2^+$ species (See, e.g., S. A. Estes et al., Anal. Chem. (1981) 53, 1829–1837; B. M. Patel et al., Anal. Chem. 1987, 59, 2374–2377; G. W. Rice et al., Spectrochim. Acta (1985) 40B, 1573–1584; and B. D. Quimby and J. J. Sulliva, Anal. Chem. (1990) 62, 1027–1034.) due to the presence of impurities such as water, $N_2$, $O_2$, and hydrocarbons. The C(I) atomic line at 247.86 nm (See, e.g., S. A. Estes et al., supra; B. M. Patel et al., supra; and B. D. Quimby and J. J. Sulliva, supra), which is commonly observed in other plasmas such as microwave induced plasma, is absent. This result may be due to several factors, such as high purity of helium, low discharge power, and short residence time (6.9 ms at a plasma gas flow rate of 1 l/min).

Figure 3:
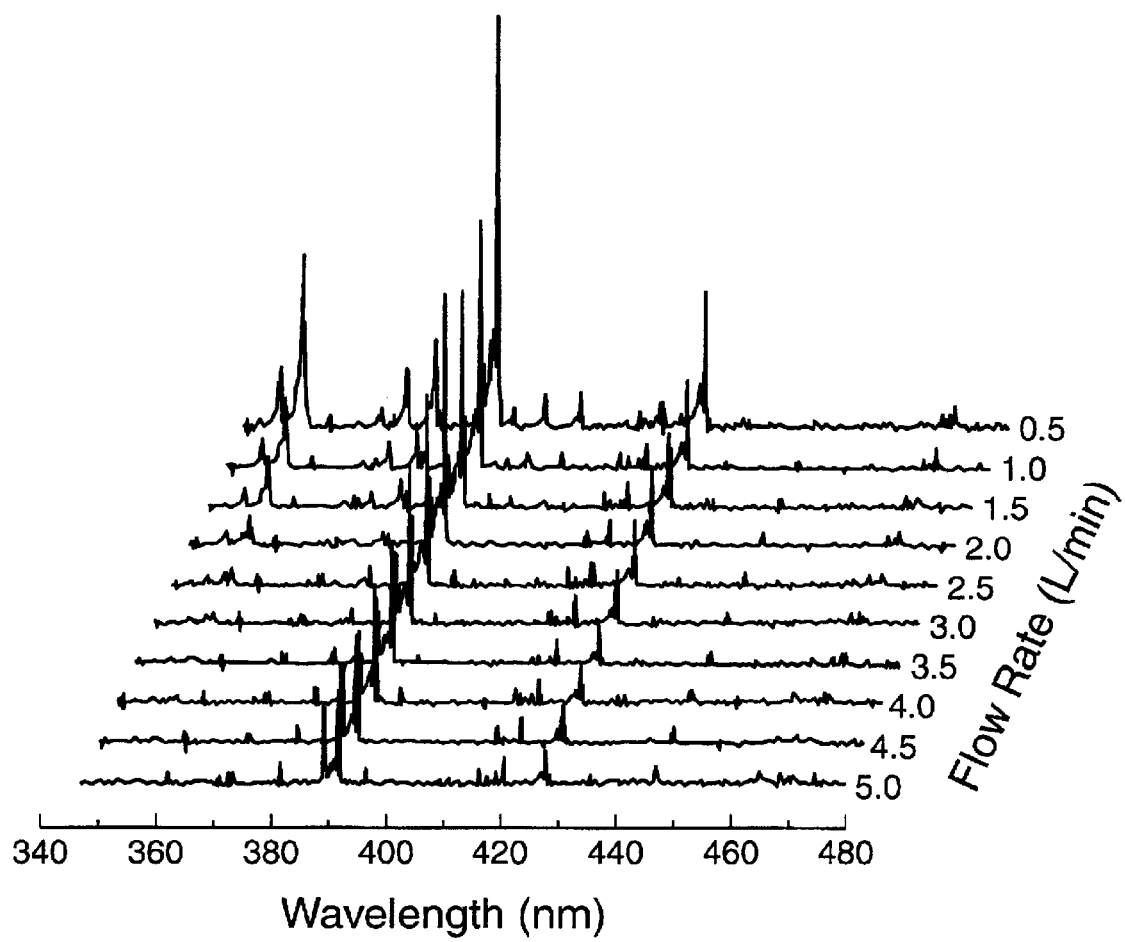
FIG. 3 shows the effect of helium gas flow rate on the background spectra where the discharge frequency is 830 Hz; $T_c$ is 1100 $\mu$s, $T_d$ is 100 $\mu$s and $E_{pri}$ is 4.55 V; the integration time is 200 ms; and the number of spectra averaged is 10.

In order to simplify the design of the present emission detector, no glass or quartz optical window was placed in the gas outlet of the detector; therefore, some back-diffusion of air into the detector at low flow rates is expected. As shown in FIG. 3, at a flow rate of 0.5 l/min, the spectrum is dominated by the molecular emission bands of $N_2$ between 340 and 360 nm. When the flow rate is increased, the intensity of $N_2$ bands decreases gradually. However, even at a flow rate of 5.0 l/min, weak $N_2$ bands still exist. Since it is unlikely that the $N_2$ bands at such a high-flow rates result from the back-diffusion of air into the detector, the nitrogen bands are likely due to the trace impurities of $N_2$ in helium (See, e.g., H. Ogino and T. Seki, Anal. Chem. (1997) 69, 3636–3640). The influence of the back-diffusion of air can be reduced by using a higher plasma gas flow rate, reducing the inner diameter of the detector, or enclosing the open end of the tubing with an optical window.

Figure 4:
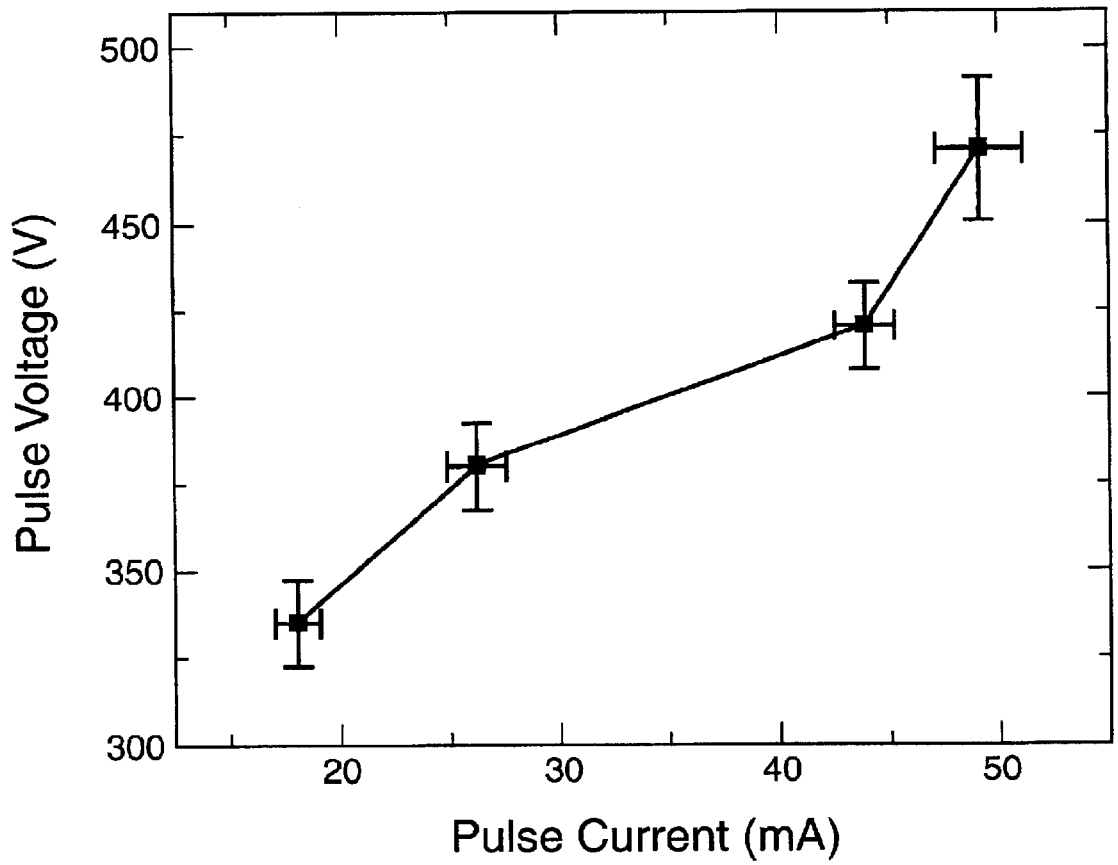
FIG. 4 shows the current/voltage curve of the pulsed helium plasma emission source of the present invention at atmospheric pressure, where the helium flow rate is 4.0 l/min; the discharge frequency is 830 Hz; and $T_c$ is 1100 $\mu$s and $T_d$ is 100 $\mu$s.

The impurities introduced into the detector through back-diffusion can affect the discharge characteristics. FIG. 4 shows the current/voltage curve at a flow rate of 4.0 l/min. A drop in plasma voltage with increasing plasma current was reported for a dc microplasma and explained as being a result of the heating of the plasma gas (See, e.g., J. C. T. Eijkel et al., Anal. Chem. (1999) 71, 2600–2606, supra). Using the present apparatus, the discharge voltage was found to increase with increasing discharge current (see FIG. 4). These voltage/current characteristics indicate that the plasma gas temperature is low. The gas temperature was estimated from the rotational temperature, which is measured from the intensity distribution of the rotational lines in the OH bands (See, e.g., I. Ishii and A. Montaser, Spectrochim. Acta (1991) 46B, 1197–1206), and gave a rotational temperature of 320±20 K. The low gas temperature can be associated with the low power used for the discharge and relatively high gas flow rates.

A stable helium plasma can be generated with an $E_{pri}$ between 2.5V and 9V independent of pulse width and pulse frequencies. The intensity of the molecular emission of nitrogen at 357.69 nm at 0.5 l/min is strongly dependent on the input voltage. At $E_{pri}$=2.5 V, a stable helium plasma was obtained; however, the emission intensity was low. The emission intensity of $N_2$ at 357.69 nm reached its maximum at $E_{pri}$=5 V, with no further increase in emission intensity when $E_{pri}$ was increased above 5 V.

Figure 5:
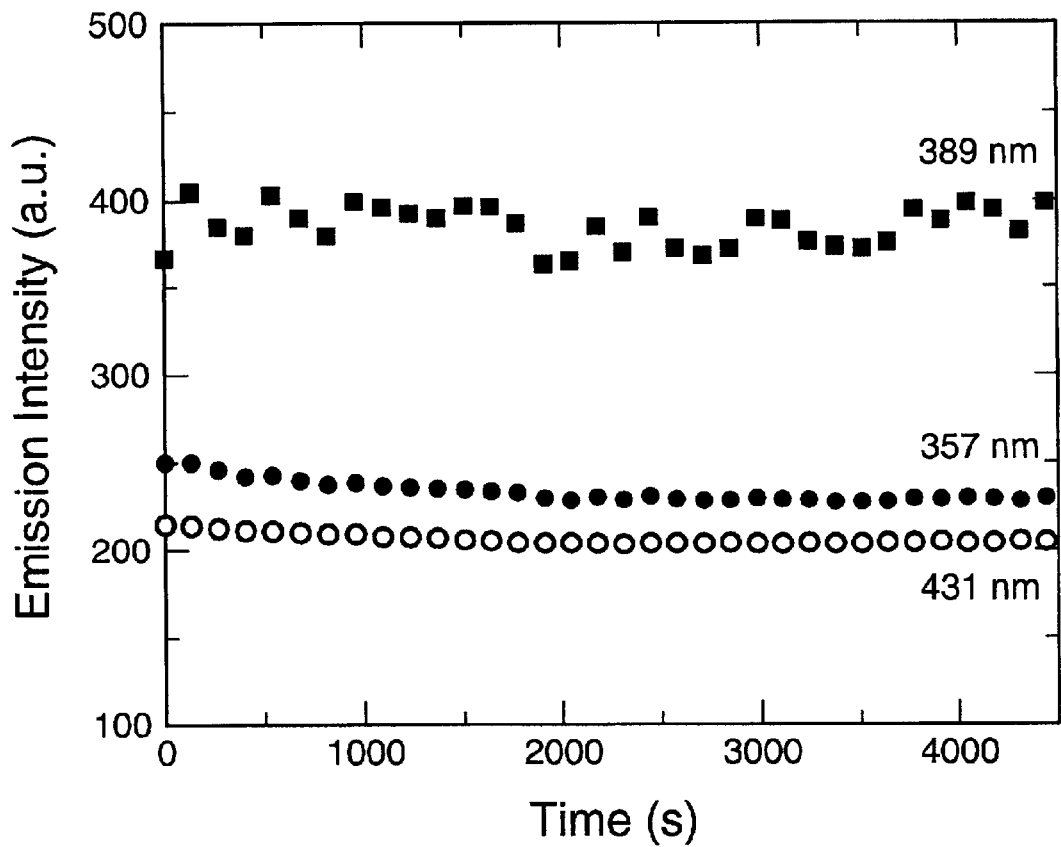
FIG. 5 shows the stability of the pulsed helium plasma emission source of the present invention, where the He flow rate is 0.5 l/min; the discharge frequency is 830 Hz; and $T_c$ is 1100 $\mu$s, $T_d$ is 100 $\mu$s and $E_{pri}$ is 5.06 V.

The stability of the emission generator/detector was examined over a period of 76 min. by measuring the background emission intensity at 431 nm, He(I) at 388.86 nm, and $N_2$ at 357.69 nm. FIG. 5 shows the change of emission intensity versus operating time. A slight drift in the background, $N_2$, and He(I) signals was observed. The relative standard deviation (RSD) for the emission intensity was 1.6% for background, 2.7% for $N_2$, and 3.3% for He(I).

Figure 6:
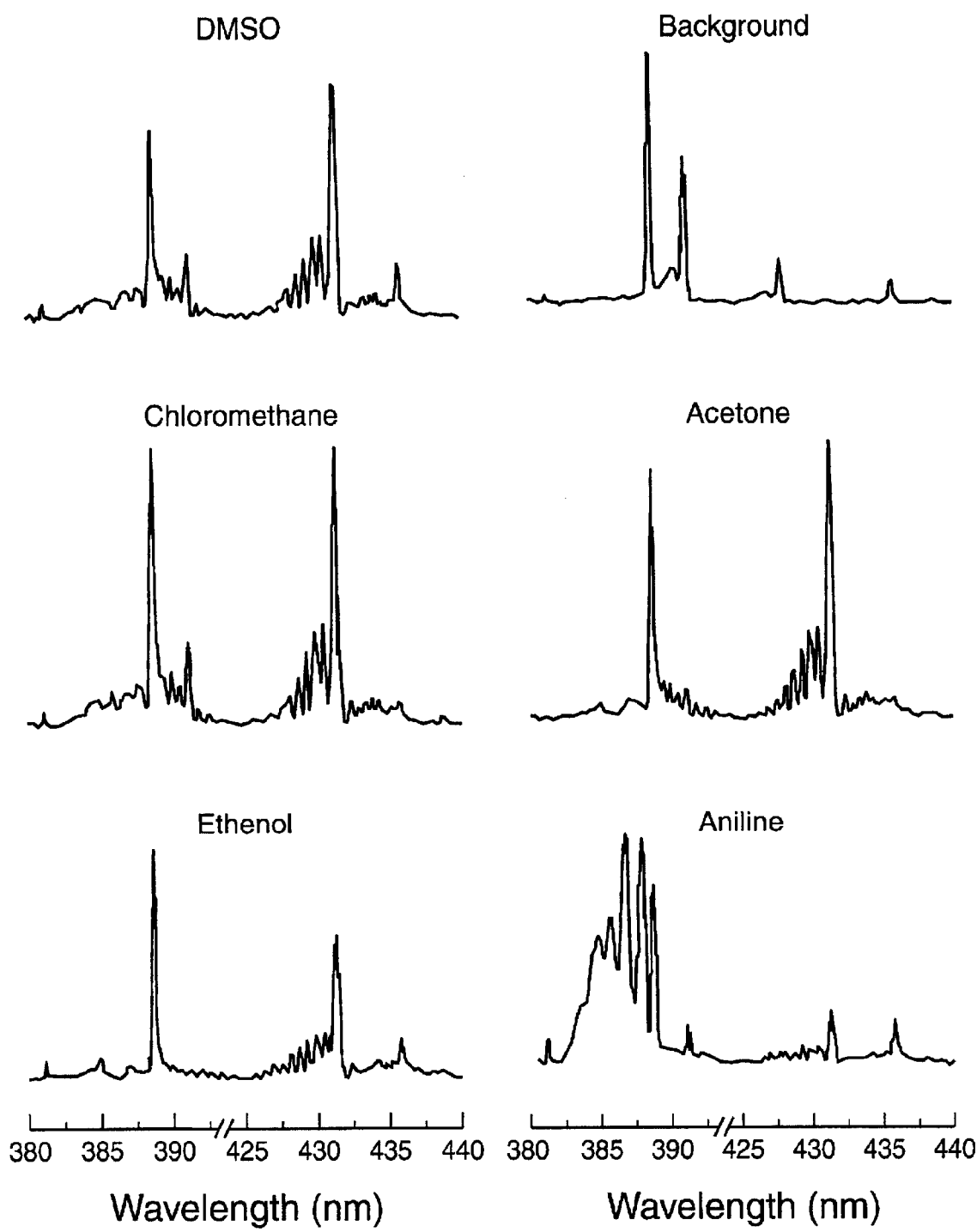
FIG. 6 shows typical emission spectra for various organic compounds obtained with the pulsed helium plasma emission source of the present invention, where the He flow rate is 1.0 l/min; the discharge frequency is 830 Hz; $T_c$ is 1100 $\mu$s, $T_d$ is 100 $\mu$s and $E_{pri}$ is 6.92 V; the integration time is 500 ms; and the number of spectra averaged is 5.

The emission spectra of organic compounds in dc discharge (See, e.g., R. S Braman and R. S. Dynako, supra) and MIP (See, e.g., A. J. McCormack et al., supra) showed prominent CN and CH bands in the region between 350 nm and 450 nm without deliberate addition of nitrogen into the plasma. Trace impurities in the plasma gas can produce an intense CN band at 388.3 nm (See, e.g., A. J. McCormack et al., supra). Typical emission spectra for organic vapors obtained with the present pulsed helium plasma generator are shown in FIG. 6. All compounds show the typical CH emission band at 431.3 nm and its rotational fine structure. However, the CN band system (See, e.g., D. G. Sutton et al., Anal. Chem. (1979) 51, 1399–1401) from 383 nm to 388 nm is very weak for most compounds except aniline. Previous work (See, e.g., R. S. Braman and A. Dynako, supra) indicated that the CN band at 388.3 nm observed for n-hexane samples in dc discharge was significantly affected by discharge power, and the CN emission intensity was small at relatively low power levels. Because the average power used for the present plasma light emission generator was less than 0.2 W, which is much lower than that employed in dc discharges (See, e.g., R. S. Braman and A. Dynako, supra), only very weak CN emission peaks were observed at 383 to 388 nm in most cases.

It is believed by the present inventors that for an organic compound which does not contain nitrogen, the formation of CN species can be attributed to chemical reactions following fragmentation of the compound into C and CH species. Because multi-step reactions are involved in the formation of CN species, the emission of CN is closely related to experimental conditions such as operational power. In helium plasmas, helium ions (21.2 eV) and metastable helium species (19 eV) have sufficient energy to break molecular bonds; therefore, CN can be directly produced from nitrogen-containing organic compounds such as aniline. The high emission intensity of CN for aniline is tentatively attributed to the direct formation of CN under the impact of highly energetic helium ions and metastable helium species.

The formation of CN from an organic compound in previously described helium plasmas may be illustrated by the following reactions (See, e.g., R. S. Braman and A. Dynako, supra):

$$CH+N_2 \rightarrow CN+NH \qquad (1)$$

$$NH+CH \rightarrow CN+H_2 \text{ (or 2H)} \qquad (2)$$

$$2C+N_2 \rightarrow 2CN \qquad (3)$$

$$2C+2NH \rightarrow 2CN+H_2 \text{ (or 2H)} \qquad (4)$$

Reactions (1) and (2) were believed to be the major source of CN, while reactions (3) and (4) were considered to be less important (See, e.g., R. S. Braman and A. Dynako, supra). However, while relatively intense CH, $N_2$, and NH emissions were observed with the present low power helium plasma, only weak CN bands were observed. Thus, there appears to be no direct correlation between CH and CN in the plasma of the present invention, and CN formation is likely to occur principally through reactions (3) and (4) rather than reactions (1) and (2).

Gases such as oxygen, hydrogen, nitrogen, or air are often added to the helium plasma in order to prevent or reduce carbon deposition inside plasma based detectors (See, e.g., W. R. McLean et al., Analyst. (1973) 98, 432–442; and L. Ebdon et al., Analyst. (1986) 111, 1113–1138). However when helium gas saturated with DMSO vapor was continuously admitted to the plasma of the present invention for more than 30 min., little carbon deposition was observed. Several factors can account for this low carbon deposition in the newly developed plasma detector. First, the plasma gas temperature was determined to be approximately 320 K, and at such a low temperature, it is difficult to produce carbon from organic vapors. Additionally, no optical window was used to enclose the gas exit of the detector, so that back-diffusion of air into the plasma can reduces or eliminate carbon deposition. Finally, the short residence time of the analyte in the detector may also reduce carbon deposition.

The back-diffusion of air into the detector generates no observable signal at 431.2 nm; therefore, the emission lines originating from the most common compounds in air do not interfere with organic vapor detection. The present molecular emission generator/detector with a helium pulsed discharge is thus well suited for trace organic vapor detection in air.

Figure 7:
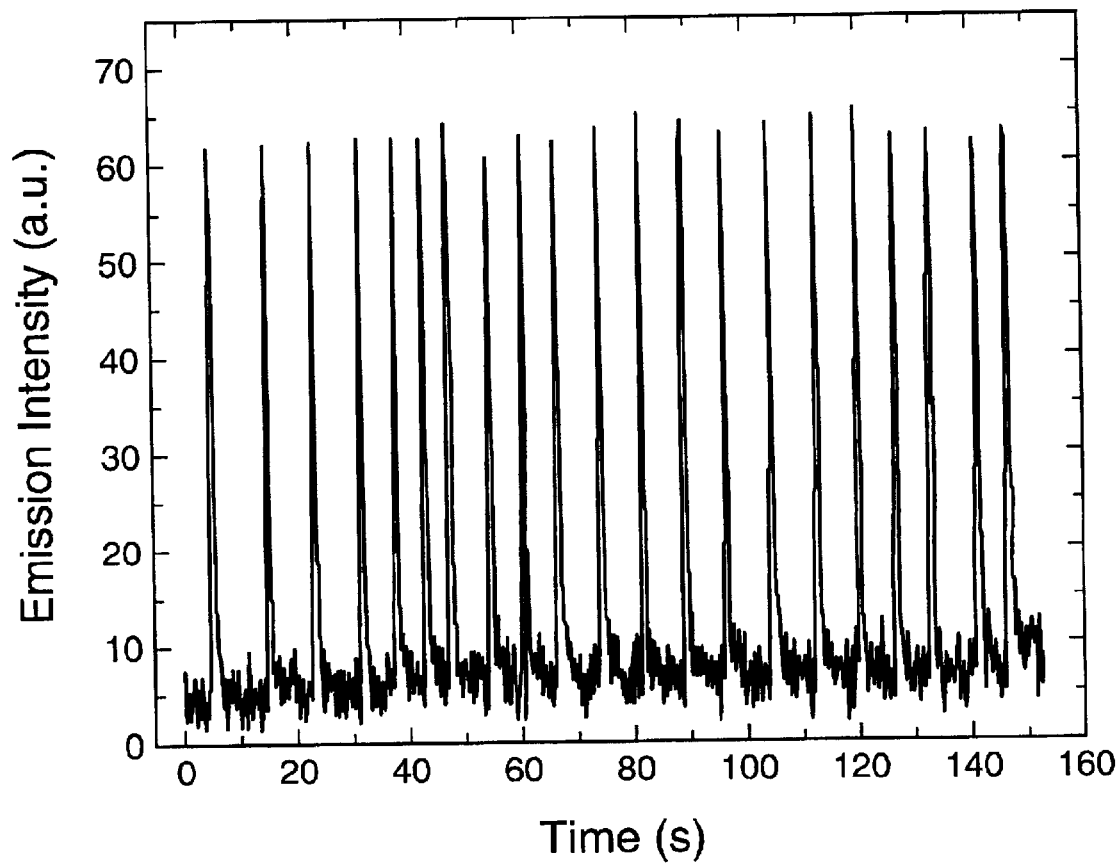
FIG. 7 shows the stability of the pulsed helium plasma emission source of the present invention when 60 ppm of DMSO is introduced into the helium plasma gas, where the He flow rate is 0.5 l/min; the integration time is 100 ms; the discharge frequency is 830 Hz; and $T_c$ is 1100 $\mu$s, $T_d$ is 100 $\mu$s and $E_{pri}$ is 5.06 V.

The reproducibility for organic vapor detection was studied. CH emission was monitored at 431.2 nm following DMSO vapor injections into the helium plasma (FIG. 7). The RSD for the emission intensity of CH was calculated to be 4.5%.

The detection limit for DMSO in ppm (v/v) was calculated from the emission intensity of 61.6 ppm DMSO as 2N/S using helium plasma (See, e.g., J. C. T. Eijkel et al. Anal. Chem. (1999) 71, 2600–2606, supra), where N is the noise level of the plasma background at 431.2 nm and S is expressed as the emission intensity at 431.2 nm per ppm of DMSO. A detection limit of 0.20 ppm for DMSO is achievable. This result is much better than that reported for methane (600 ppm) in a dc microplasma based on the same CH band (See, e.g., J. C. T. Eijkel et al. Anal. Chem. (1999) 71, 2600–2606, supra).

The foregoing description of the invention has been presented for purposes of illustration and description and is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A pulsed, atmospheric pressure plasma apparatus for generating and analyzing light emission characteristic of species in the plasma, which comprises in combination:
   (a) an electrically insulating hollow tube open at one end and having a wall;
   (b) a grounded metallic electrode piercing the wall of said hollow tube;
   (c) a second metallic electrode piercing the wall of said hollow tube in the vicinity of said grounded electrode;
   (d) means for flowing a gas in which the species is entrapped through said hollow tube;
   (e) a high voltage dc pulse generator in electrical contact with said second electrode for generating a pulsed plasma in the gas flowing between said grounded electrode and said second electrode; and
   (f) an optical spectrometer for spectrally resolving and detecting the light emission exiting the open end of said hollow tube characteristic of the species entrapped in the gas.

2. The pulsed, atmospheric pressure plasma apparatus for generating and analyzing light emission characteristic of species in the plasma as described in claim 1, wherein the light emission from the species comprises molecular light emission.

3. The pulsed, atmospheric pressure plasma apparatus for generating and analyzing light emission characteristic of species in the plasma as described in claim 1, wherein said grounded electrode and said second electrode are disposed in opposition to one another.

4. The pulsed, atmospheric pressure plasma apparatus for generating and analyzing light emission characteristic of species in the plasma as described in claim 1, wherein said grounded electrode and said second electrode are both substantially planar electrodes disposed parallel to each other.

5. The pulsed, atmospheric pressure plasma apparatus for generating and analyzing light emission characteristic of species in the plasma as described in claim 1, wherein the flowing gas is selected from the group consisting of helium, argon, nitrogen and air.

6. The pulsed, atmospheric pressure plasma apparatus for generating and analyzing light emission characteristic of species in the plasma as described in claim 1, wherein the species comprise organic molecules.

7. The pulsed, atmospheric pressure plasma apparatus for generating and analyzing light emission characteristic of species in the plasma as described in claim 1, wherein the high voltage pulse generator produces a pulsed voltage of between 0.3 keV and 5 keV between said grounded electrode and said second electrode.

8. The pulsed, atmospheric pressure plasma apparatus for generating and analyzing light emission characteristic of species in the plasma as described in claim 7, wherein the pulsed voltage is applied to the gas for between 30 and 300 $\mu s$.

9. The pulsed, atmospheric pressure plasma apparatus for generating and analyzing light emission characteristic of species in the plasma as described in claim 7, wherein the average electrical power applied to the gas is between 0.02 W and 5 W.

10. The pulsed, atmospheric pressure plasma apparatus for generating and analyzing light emission characteristic of species in the plasma as described in claim 1, wherein said hollow tube comprises plastic tubing.

11. The pulsed, atmospheric pressure plasma apparatus for generating and analyzing light emission characteristic of species in the plasma as described in claim 1, wherein the region where said ground electrode and said second electrode pierce said hollow tube is sealed using a sealant to prevent leakage of the flowing gas from said hollow tube.

12. The pulsed, atmospheric pressure plasma apparatus for generating and analyzing light emission characteristic of species in the plasma as described in claim 1, further comprising an optically transparent window for sealing the open end of said hollow tube, thereby preventing back-diffusion of ambient air into said hollow tube.

13. The pulsed, atmospheric pressure plasma apparatus for generating and analyzing light emission characteristic of species in the plasma as described in claim 1, wherein the gas in which the species is entrapped derives from the output of a vapor phase chromatograph.

14. A pulsed, atmospheric pressure plasma apparatus for generating and analyzing light emission characteristic of species in the plasma which comprises in combination:
   (a) an electrically insulating hollow tube open at one end and having a wall;
   (b) a grounded metallic electrode piercing the wall of said hollow tube;
   (c) a second metallic electrode piercing the wall of said hollow tube in the vicinity of said grounded electrode;
   (d) means for flowing a gas in which the species is entrapped through said hollow tube;
   (e) means for generating a dc pulsed plasma in the gas flowing between said grounded electrode and said second electrode; and
   (f) means for spectrally resolving and detecting light emission exiting the open end of said hollow tube characteristic of the species entrapped in the gas.

15. The pulsed, atmospheric pressure plasma apparatus for generating and analyzing light emission characteristic of species in the plasma as described in claim 14, wherein the light emission from the species comprises molecular light emission.

16. The pulsed, atmospheric pressure plasma apparatus for generating and analyzing light emission characteristic of species in the plasma as described in claim 14, wherein said grounded electrode and said second electrode are disposed in opposition to one another.

17. The pulsed, atmospheric pressure plasma apparatus for generating and analyzing light emission characteristic of species in the plasma as described in claim 16, wherein said grounded electrode and said second electrode are both substantially planar electrodes disposed parallel to each other.

18. The pulsed, atmospheric pressure plasma apparatus for generating and analyzing light emission characteristic of species in the plasma as described in claim 14, wherein the flowing gas is selected from the group consisting of helium, argon, nitrogen and air.

19. The pulsed, atmospheric pressure plasma apparatus for generating and analyzing light emission characteristic of species in the plasma as described in claim 14, wherein the species comprise organic molecules.

20. The pulsed, atmospheric pressure plasma apparatus for generating and analyzing light emission characteristic of species in the plasma as described in claim 14, wherein the high voltage pulse generator produces a pulsed voltage of between 0.3 keV and 5 keV between said grounded electrode and said second electrode.

21. The pulsed, atmospheric pressure plasma apparatus for generating and analyzing light emission characteristic of species in the plasma as described in claim 20, wherein the pulsed voltage is applied to the gas for between 30 and 300 µs.

22. The pulsed, atmospheric pressure plasma apparatus for generating and analyzing light emission characteristic of species in the plasma as described in claim 20, wherein the average electrical power applied to the gas is between 0.02 W and 5 W.

23. The pulsed, atmospheric pressure plasma apparatus for generating and analyzing light emission characteristic of species in the plasma as described in claim 14, wherein said hollow tube comprises plastic tubing.

24. The pulsed, atmospheric pressure plasma apparatus for generating and analyzing light emission characteristic of species in the plasma as described in claim 14, wherein the region where said ground electrode and said second electrode pierce said hollow tube is sealed using a sealant to prevent leakage of the flowing gas from said hollow tube.

25. The pulsed, atmospheric pressure plasma apparatus for generating and analyzing light emission characteristic of species in the plasma as described in claim 14, further comprising an optically transparent window for sealing the open end of said hollow tube, thereby preventing back-diffusion of ambient air into said hollow tube.

26. The pulsed, atmospheric pressure plasma apparatus for generating and analyzing light emission characteristic of species in the plasma as described in claim 14, wherein the gas in which the species is entrapped derives from the output of a vapor phase chromatograph.

27. The pulsed, atmospheric pressure plasma apparatus for generating and analyzing light emission characteristic of species in the plasma as described in claim 14, wherein said means for spectrally resolving and detecting light emission from the species entrapped comprises an optical spectrometer.

28. The pulsed, atmospheric pressure plasma apparatus for generating and analyzing light emission characteristic of species in the plasma as described in claim 14, wherein said means for generating a pulsed plasma comprises a high voltage dc pulse generator in electrical contact with said second electrode.

29. A pulsed, atmospheric pressure plasma method for generating and analyzing light emission characteristic of species in the plasma which comprises the steps of:
  (a) flowing a gas containing the species through an insulating hollow tube open at one end;
  (b) generating a pulsed plasma between a grounded electrode and a second electrode disposed in the electrically insulating hollow tube by applying a pulsed dc voltage to the second electrode, whereby the species are excited; and
  (c) spectrally resolving and detecting light emission exiting the hollow tube from the open end thereof.

30. The pulsed, atmospheric pressure plasma method for generating and analyzing light emission characteristic of species in the plasma as described in claim 29, wherein the light emission from the species comprises molecular light emission.

31. The pulsed, atmospheric pressure plasma method for generating and analyzing light emission characteristic of species in the plasma as described in claim 29, wherein said grounded electrode and said second electrode are disposed in opposition to one another.

32. The pulsed, atmospheric pressure plasma method for generating and analyzing light emission characteristic of species in the plasma as described in claim 31, wherein said grounded electrode and said second electrode are both substantially planar electrodes disposed parallel to each other.

33. The pulsed, atmospheric pressure plasma method for generating and analyzing light emission characteristic of species in the plasma as described in claim 29, wherein the flowing gas is selected from the group consisting of helium, argon, nitrogen and air.

34. The pulsed, atmospheric pressure plasma method for generating and analyzing light emission characteristic of species in the plasma as described in claim 29, wherein the species comprise organic molecules.

35. The pulsed, atmospheric pressure plasma method for generating and analyzing light emission characteristic of species in the plasma as described in claim 29, wherein the pulsed plasma is generated by applying a pulsed voltage of between 0.3 keV and 5 keV between the grounded electrode and the second electrode.

36. The pulsed, atmospheric pressure plasma method for generating and analyzing light emission characteristic of species in the plasma as described in claim 35, wherein the pulsed voltage is applied to the gas for between 30 and 300 µs.

37. The pulsed, atmospheric pressure plasma method for generating and analyzing light emission characteristic of species in the plasma as described in claim 35, wherein the average electrical power used to generate the plasma is between 0.02 W and 5 W.

38. The pulsed, atmospheric pressure plasma method for generating and analyzing light emission characteristic of species in the plasma as described in claim 29, wherein the hollow tube comprises plastic tubing.

39. The pulsed, atmospheric pressure plasma method for generating and analyzing light emission characteristic of species in the plasma as described in claim 29, wherein an optically transparent window is used for sealing the open end of the hollow tube, thereby preventing back-diffusion of ambient air into the hollow tube.

40. The pulsed, atmospheric pressure plasma method for generating and analyzing light emission characteristic of species in the plasma as described in claim 29, wherein the gas in which the species is entrapped derives from the output of a vapor phase chromatograph.

41. A pulsed, atmospheric pressure plasma apparatus for generating and analyzing light emission characteristic of organic species in the plasma which comprises in combination:
  (a) an electrically insulating hollow tube open at one end and having a wall;
  (b) a grounded metallic electrode piercing the wall of said hollow tube;
  (c) a second metallic electrode piercing the wall of said hollow tube in the vicinity of said grounded electrode, wherein said grounded electrode and said second electrode are both substantially planar electrodes disposed parallel to each other;
  (d) means for flowing a gas in which the organic species is entrapped through said hollow tube;
  (e) a high voltage dc pulse generator in electrical contact with said second electrode for generating a pulsed plasma in the gas flowing between said grounded electrode and said second electrode; and (f) an optical spectrometer for spectrally resolving and detecting the light emission exiting the open end of said hollow tube characteristic of the organic species entrapped in the gas.

42. The pulsed, atmospheric pressure plasma apparatus for generating and analyzing light emission characteristic of organic species in the plasma as described in claim 41, wherein the light emission from the species comprises molecular light emission.

43. The pulsed, atmospheric pressure plasma apparatus for generating and analyzing light emission characteristic of organic species in the plasma as described in claim 41, wherein the flowing gas is selected from the group consisting of helium, argon, nitrogen and air.

44. The pulsed, atmospheric pressure plasma apparatus for generating and analyzing light emission characteristic of organic species in the plasma as described in claim 41, wherein the high voltage pulse generator produces a pulsed voltage of between 0.3 keV and 5 keV between said grounded electrode and said second electrode.

45. The pulsed, atmospheric pressure plasma apparatus for generating and analyzing light emission characteristic of organic species in the plasma as described in claim 44, wherein the pulsed voltage is applied to the gas for between 30 and 300 $\mu$s.

46. The pulsed, atmospheric pressure plasma apparatus for generating and analyzing light emission characteristic of organic species in the plasma as described in claim 44, wherein the average electrical power applied to the gas is between 0.02 W and 5 W.

47. The pulsed, atmospheric pressure plasma apparatus for generating and analyzing light emission characteristic of organic species in the plasma as described in claim 41, wherein said hollow tube comprises plastic tubing.

48. The pulsed, atmospheric pressure plasma apparatus for generating and analyzing light emission characteristic of organic species in the plasma as described in claim 41, wherein the region where said ground electrode and said second electrode pierce said hollow tube is sealed using a sealant to prevent leakage of the flowing gas from said hollow tube.

49. The pulsed, atmospheric pressure plasma apparatus for generating and analyzing light emission characteristic of organic species in the plasma as described in claim 41, further comprising an optically transparent window for sealing the open end of said hollow tube, thereby preventing back-diffusion of ambient air into said hollow tube.

50. The pulsed, atmospheric pressure plasma apparatus for generating and analyzing light emission characteristic of organic species in the plasma as described in claim 41, wherein the gas in which the species is entrapped derives from the output of a vapor phase chromatograph.

* * * * *